United States Patent
Hase et al.

(10) Patent No.: US 9,739,838 B2
(45) Date of Patent: Aug. 22, 2017

(54) BATTERY MONITORING DEVICE

(71) Applicant: KABUSHIKI KAISHA TOYOTA JIDOSHOKKI, Aichi (JP)

(72) Inventors: Ryusuke Hase, Kariya (JP); Takahiro Tsuzuku, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days.

(21) Appl. No.: 15/127,255

(22) PCT Filed: Dec. 3, 2014

(86) PCT No.: PCT/JP2014/082042
§ 371 (c)(1),
(2) Date: Sep. 19, 2016

(87) PCT Pub. No.: WO2015/145877
PCT Pub. Date: Oct. 1, 2015

(65) Prior Publication Data
US 2017/0108555 A1 Apr. 20, 2017

(30) Foreign Application Priority Data
Mar. 25, 2014 (JP) ................................. 2014-061020

(51) Int. Cl.
*B60Q 1/00* (2006.01)
*G08B 21/00* (2006.01)
(Continued)

(52) U.S. Cl.
CPC ..... *G01R 31/3689* (2013.01); *G01R 31/3606* (2013.01); *G01R 31/3658* (2013.01);
(Continued)

(58) Field of Classification Search
None
See application file for complete search history.

(56) References Cited

U.S. PATENT DOCUMENTS 6,072,300 A * 6/2000 Tsuji ..................... G01R 31/362
320/116
6,088,726 A 7/2000 Watanabe
(Continued)

FOREIGN PATENT DOCUMENTS

DE 10 2011 101 067 12/2011
EP 2 293 375 3/2011
(Continued)

OTHER PUBLICATIONS

Written Opinion of the International Searching Authority for International Application No. PCT/JP2014/082042, dated Mar. 3, 2015, along with a partial English translation.
(Continued)

*Primary Examiner* — Steven Lim
*Assistant Examiner* — Muhammad Adnan
(74) *Attorney, Agent, or Firm* — Greenblum & Bernstein, P.L.C.

(57) ABSTRACT

Each of a plurality of monitoring units, when identification information is not set for it, transmits, to a subsequent monitoring unit or a control unit, a fixed unset signal that indicates that identification information has not been set for it, regardless of signal transmitted from the previous monitoring unit or the control unit, and the control unit, upon receiving the unset signal transmitted from a last monitoring unit, shifts to an identification information setting process.

8 Claims, 15 Drawing Sheets

(51) Int. Cl.
*G08B 23/00* (2006.01)
*G01V 3/00* (2006.01)
*G01R 31/36* (2006.01)
*G08B 21/18* (2006.01)
*H01M 10/48* (2006.01)
*H01M 10/0525* (2010.01)
*H01M 10/42* (2006.01)

(52) U.S. Cl.
CPC ........ *G08B 21/18* (2013.01); *H01M 10/0525* (2013.01); *H01M 10/425* (2013.01); *H01M 10/486* (2013.01); *H01M 10/488* (2013.01); *H01M 2010/4278* (2013.01)

(56) References Cited

U.S. PATENT DOCUMENTS

| | | | | |
|---|---|---|---|---|
| 8,347,383 | B2* | 1/2013 | Mori | H04L 41/22 713/188 |
| 8,421,413 | B2* | 4/2013 | Mizoguchi | G01R 31/3658 320/119 |
| 8,432,132 | B2* | 4/2013 | Nakanishi | H02J 7/0016 320/116 |
| 8,723,481 | B2* | 5/2014 | Zhang | H01M 10/441 320/116 |
| 8,908,677 | B2* | 12/2014 | Welin | H04L 12/12 370/349 |
| 9,279,860 | B2* | 3/2016 | Sekiguchi | G01R 31/3644 |
| 2011/0175574 | A1 | 7/2011 | Sim et al. | |
| 2011/0279087 | A1 | 11/2011 | Andres et al. | |
| 2015/0069974 | A1* | 3/2015 | Okada | G01R 31/3658 320/134 |
| 2015/0244191 | A1* | 8/2015 | Matsumura | H02J 7/0021 320/116 |

FOREIGN PATENT DOCUMENTS

| | | | | |
|---|---|---|---|---|
| JP | 7-225733 | | 8/1995 | |
| JP | 11-177593 | | 7/1999 | |
| JP | 11177593 | A * | 7/1999 | ............. H04L 12/42 |
| JP | 2001-203733 | | 7/2001 | |
| JP | 2001203733 | A * | 7/2001 | |
| JP | 2003009403 | A * | 1/2003 | |

OTHER PUBLICATIONS

International Search Report for International Patent Application No. PCT/JP2014/082042, dated Mar. 3, 2015, along with English translation.

* cited by examiner

| DUTY RATIO OF RECEIVED RECTANGULAR WAVE | TYPE OF SIGNAL EQUIVALENT TO RECEIVED RECTANGULAR WAVE |
|---|---|
| 50% | UNSET SIGNAL |
| 4% | SETTING SIGNAL |
| 8% | SETTING SIGNAL |
| 12% | SETTING SIGNAL |
| 16% | SETTING SIGNAL |
| 20% | SETTING SIGNAL |

FIG. 6

| DUTY RATIO OF RECEIVED RECTANGULAR WAVE | IDENTIFICATION INFORMATION |
|---|---|
| 4% | 101 |
| 8% | 102 |
| 12% | 103 |
| 16% | 104 |
| 20% | 105 |

FIG. 7

| DUTY RATIO OF RECEIVED RECTANGULAR WAVE | NUMBER OF MONITORING UNITS |
|---|---|
| 8 % | 1 |
| 12 % | 2 |
| 16 % | 3 |
| 20 % | 4 |
| 24 % | 5 |

F I G. 8

| DUTY RATIO OF RECEIVED RECTANGULAR WAVE | TYPE OF SIGNAL EQUIVALENT TO RECEIVED RECTANGULAR WAVE |
|---|---|
| 50% | UNSET SIGNAL |
| 4% | SETTING SIGNAL |
| 8% | SETTING SIGNAL |
| 12% | SETTING SIGNAL |
| 16% | SETTING SIGNAL |
| 20% | SETTING SIGNAL |
| 54% | ABNORMAL SIGNAL |
| 58% | ABNORMAL SIGNAL |
| 62% | ABNORMAL SIGNAL |
| 66% | ABNORMAL SIGNAL |
| 70% | ABNORMAL SIGNAL |

FIG. 11

| DUTY RATIO OF RECEIVED RECTANGULAR WAVE | OCCURRENCE LOCATION OF COMMUNICATION ABNORMALITY |
|---|---|
| 70% | BETWEEN CONTROL UNIT 3 AND MONITORING UNIT 10-1 |
| 66% | BETWEEN MONITORING UNITS 10-1 AND 10-2 |
| 62% | BETWEEN MONITORING UNITS 10-2 AND 10-3 |
| 58% | BETWEEN MONITORING UNITS 10-3 AND 10-4 |
| 54% | BETWEEN MONITORING UNITS 10-4 AND 10-5 |

FIG. 12

| DUTY RATIO OF RECEIVED RECTANGULAR WAVE | TYPE OF SIGNAL EQUIVALENT TO RECEIVED RECTANGULAR WAVE |
|---|---|
| 50% | UNSET SIGNAL |
| 10% | DETECTION SIGNAL |
| 54% | ABNORMAL SIGNAL |
| 58% | ABNORMAL SIGNAL |
| 62% | ABNORMAL SIGNAL |
| 66% | ABNORMAL SIGNAL |
| 70% | ABNORMAL SIGNAL |

FIG. 15

BATTERY MONITORING DEVICE

FIELD

The present invention is related to a technique of monitoring states of a plurality of batteries.

BACKGROUND

In recent years, there have been cases where a plurality of batteries are connected in parallel as a battery device mounted on vehicles such as electric forklift trucks, hybrid automobiles, electric automobiles, etc. in order to supply a large amount of electricity to the load in a stable manner.

Also, there is a battery monitoring device, for monitoring the state of each of such batteries, that is provided with a control unit for permitting the charging/discharging of each battery in accordance with the monitoring result of each battery. In these battery monitoring devices, identification information has to be set for each monitoring unit in order to transmit monitoring results from a plurality of monitoring units to the control unit, the monitoring units being for monitoring the states of the batteries.

There is a technique in which when for example respective monitoring units and the control unit are connected in series, each of the monitoring units adds, to a packet to be transmitted from a previous monitoring unit, information representing whether or not the identification information is set to itself so as to transmit it to a subsequent monitoring unit and the control unit sets identification information for a monitoring unit which is identified by the information added to a packet transmitted from the last monitoring unit and for which identification information is not set (Patent Document 1 for example).

Patent Document 1: Japanese Laid-open Patent Publication No. 2001-203733

SUMMARY

However, as described above, a communication abnormality occurring between monitoring units in a configuration where each monitoring unit and the control unit are connected in series may lead to a situation where signals from the monitoring units do not reach the control unit and it is not possible to shift to a next process such as an identification information setting process.

In response to the above situation, it is an object of the present invention to provide a battery monitoring device that can shift to a next process even when a communication abnormality has occurred between monitoring units in a case where respective monitoring units for monitoring states of a plurality of batteries and a control unit for communicating with each monitoring unit are connected in series.

A battery monitoring device according to the present embodiment includes a plurality of monitoring units that monitor a state of a battery, and a control unit that is connected to the plurality of monitoring units in series and that communicates with the plurality of monitoring units by using identification information set for the plurality of monitoring units.

Also, each of the plurality of monitoring units, when identification information is not set therefor, transmits, to the subsequent monitoring unit or the control unit, a fixed unset signal that indicates that identification information has not been set therefor, regardless of signal transmitted from the previous monitoring unit or the control unit.

Also, upon receiving the unset signal transmitted from the last monitoring unit, the control unit shifts to at least one of an identification information setting process and a communication abnormality detection process.

Thereby, because an unset signal is transmitted to the control unit from the last monitoring unit even when a communication abnormality has occurred between the monitoring units with identification information not set for at least the last monitoring unit, it is possible to shift to a next process such as the identification information setting process or the communication abnormality detection process.

The present invention makes it possible to shift to a next process even when a communication abnormality has occurred between monitoring units in a case where monitoring units for monitoring states of a plurality of batteries and a control unit for communicating with each monitoring unit are connected in series.

BRIEF DESCRIPTION OF DRAWINGS

FIG. 6 shows an example of information stored in a storage unit;

FIG. 7 shows an example of information stored in the storage unit;

FIG. 8 shows an example of information stored in the storage unit;

FIG. 11 shows an example of information stored in the storage unit;

FIG. 12 shows an example of information stored in the storage unit;

FIG. 15 shows an example of information stored in the storage unit.

DESCRIPTION OF EMBODIMENTS

Figure 1:
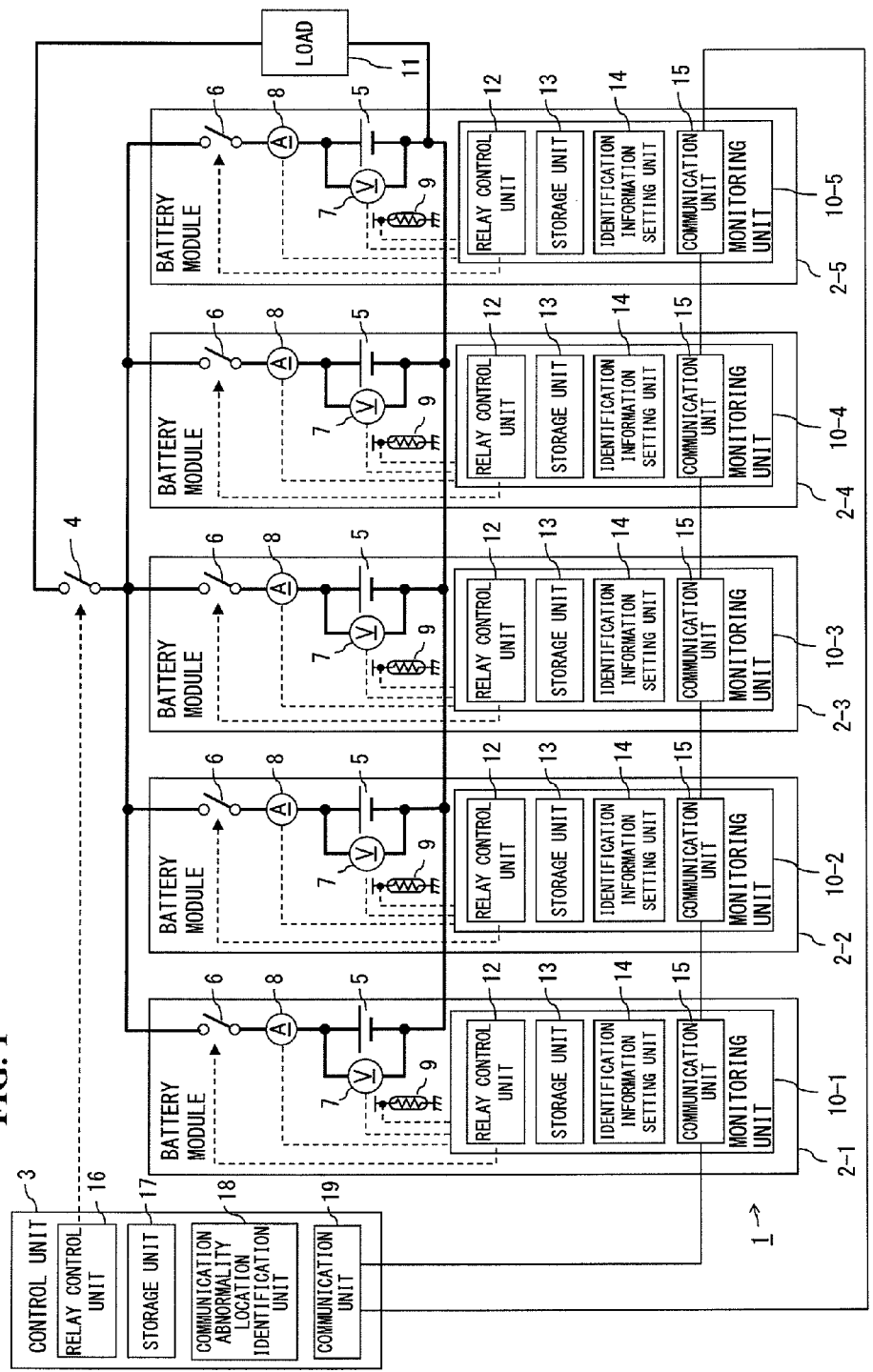
FIG. 1 shows a battery monitoring device according to an embodiment.

FIG. 1 shows a battery monitoring device of an embodiment.

A battery monitoring device 1 shown in FIG. 1 includes five battery modules 2 (2-1 through 2-5), a control unit (battery Electronic Control Unit (ECU)) 3 and a main relay 4. The battery monitoring device 1 is mounted on a vehicle such as an electric forklift truck, a hybrid automobile, an electric automobile, etc. The number of the battery modules 2 is not limited to five.

The battery modules 2-1 through 2-5 each have a battery 5, a relay 6, a voltage detection unit 7, a current detection unit 8, a temperature detection unit 9, and a monitoring unit (monitoring ECU) 10 (10-1 through 10-5). The respective batteries 5 are connected in parallel so as to supply electric power to a load 11.

The batteries 5 are rechargeable batteries and are for example a lithium-ion secondary battery, a nickel metal-hydride battery, etc. Note that the batteries 5 may be configured of a plurality of batteries that are connected in series.

The relays 6 are provided between the main relay 4 and the batteries 5. When the main relay 4 is turned on with the relays 6 in an on state, electric power can be supplied from the batteries 5 to the load 11.

The voltage detection units 7 detect voltages of the batteries 5, and are for example voltmeters.

The current detection units 8 detect currents flowing to the batteries 5 for charging and currents flowing from the battery 5 for discharging, and are for example ammeters.

The temperature detection units 9 detect ambient temperatures of the batteries 5, and are for example thermistors.

The monitoring units 10-1 through 10-5 each have a relay control unit 12, a storage unit 13, an identification information setting unit 14 and a communication unit 15. The relay control units 12, the identification information setting units 14, and the communication units 15 are configured of for example CPUs (central processing units), multi-core CPUs, programmable devices (such as FPGAs (Field Programmable Gate Arrays), PLDs (Programmable Logic Devices), etc.), and are implemented by a CPU, a multi-core CPU, a programmable device, etc. reading and implementing a program stored in the storage unit 13. Also, the communication units 15 of the monitoring units 10-1 through 10-5 and a communication unit 19 of the control unit 3 are connected in series to form a loop (daisy chain).

The relay control units 12 perform on/off control for the relays 6.

The storage units 13 are for example a ROM (read only memory), a RAM (random access memory), etc., and store various types of information and various types of programs.

The identification information setting units 14 set the identification information for themselves, and store that identification information in the storage units 13. When for example five pieces of identification information of "101", "102", "103", "104" and "105" are set for the monitoring units 10-1 through 10-5, the identification information setting unit 14 of the first monitoring unit 10-1 sets "101" as the identification information for itself and stores it in the storage unit 13. Also, the identification information setting unit 14 of the second monitoring unit 10-2 sets "102" as the identification information for itself and stores it in the storage unit 13. Also, the identification information setting unit 14 of the third monitoring unit 10-3 sets "103" as the identification information for itself and stores it in the storage unit 13. Also, the identification information setting unit 14 of the fourth monitoring unit 10-4 sets "104" as the identification information for itself and stores it in the storage unit 13. Also, the identification information setting unit 14 of the last monitoring unit 10-5 sets "105" as the identification information for itself and stores it in the storage unit 13.

The communication units 15 receive signals transmitted from the previous monitoring units 10 or the control unit 3 and transmit signals to the subsequent monitoring units 10 or the control unit 3 via a communication line.

The control unit 3 includes a relay control unit 16 that performs the on/off control of the main relay 4, a storage unit 17, a communication abnormality location identification unit 18, and a communication unit 19 that communicates with the monitoring units 10-1 through 10-5. Note that the storage unit 17 is for example a ROM or a RAM, and stores various types of information and programs. Also, the relay control unit 16, the communication abnormality location identification unit 18 and the communication unit 19 are configured of for example CPUs, multi-core CPUs, programmable devices, etc., and are implemented by a CPU, a multi-core CPU, a programmable device, etc. reading and implementing a program stored in the storage unit 17. The control unit 3 receives, via the communication unit 19, pieces of identification information transmitted from the monitoring units 10-1 through 10-5, and stores them in the storage unit 17. Also, the control unit 3 receives, in the communication unit 19 and by using identification information stored in the storage unit 17, information representing the states of the batteries 5 (for example, the voltages, currents, temperatures, etc. of the batteries 5) transmitted from the monitoring units 10-1 through 10-5. Also, when the state of the battery 5 represented by received information enters a prescribed state (when for example at least one of the voltage, current and temperature of the battery 5 is greater than a threshold), the control unit 3 determines the state of at least one of the batteries 5 of the battery modules 2-1 through 2-5 to be abnormal and shifts to the evacuation running mode (for example, a process in which it transmits, to a higher-order control unit that controls the movement of the vehicle, an instruction to gradually slow down the vehicle before a prescribe period of time elapses and turns off the main relay 4 by using the relay control unit 16 after the prescribed period of time elapses). Also, upon determining that a communication abnormality has occurred, the control unit 3 shifts to the evacuation running mode.

Figure 2:
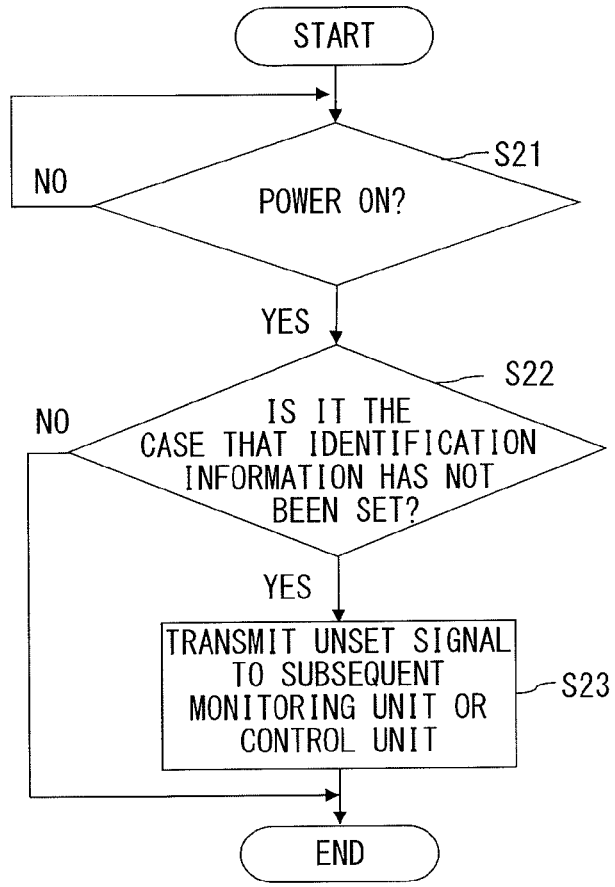
FIG. 2 is a flowchart showing operations of monitoring unit.

FIG. 2 is a flowchart showing operations of each of the monitoring units 10-1 through 10-5.

First, each of the monitoring units 10-1 through 10-5, having its power source turned on (Yes in S21), determines whether it is the case that its identification information has not been set (S22).

Next, each of the monitoring units 10-1 through 10-5, when it determines that it is the case that identification information has been set for it (No in S22), terminates the process without doing anything, and when it determines that its identification information has not been set (Yes in S22), it transmits, to the subsequent monitoring unit 10 or the control unit 3, a fixed unset signal that indicates that its identification information has not been set, regardless of signal transmitted from the previous monitoring unit 10 or the control unit 3 (S23).

Figure 3:
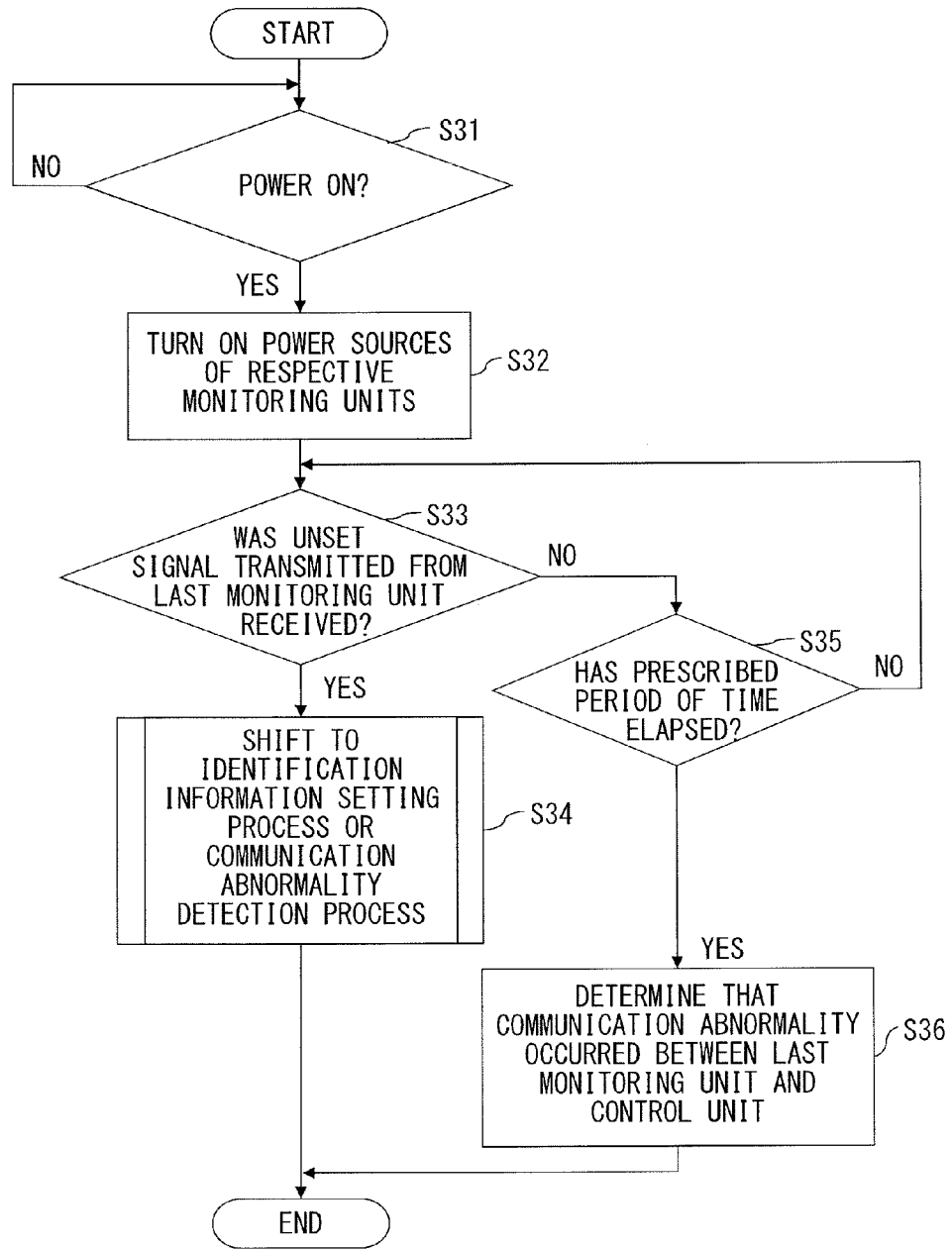
FIG. 3 is a flowchart showing operations of a control unit.

FIG. 3 is a flowchart showing operations of the control unit 3.

First, the control unit 3, having its power source turned on (Yes in S31), turns on the power sources of the monitoring units 10-1 through 10-5 (S32).

Next, upon receiving an unset signal transmitted from the last monitoring unit 10-5 between the turning on of the power sources of the monitoring units 10-1 through 10-5 and the elapsing of a prescribed period of time (Yes in S33), the control unit 3 shifts to the identification information setting process or the communication abnormality detection process (S34), and upon not receiving an unset signal before the elapsing of the prescribed period of time (No in S33 and Yes in S35), the control unit 3 determines that a communication abnormality occurred between the last monitoring unit 10-5 and the control unit 3 (S36).

Thereby, the battery monitoring device 1 can shift to a next process such as the identification information setting process or the communication abnormality detection process because when identification information is not set for at least the last monitoring unit 10-5, an unset signal is transmitted from the last monitoring unit 10-5 to the control unit 3 even when a communication abnormality has occurred between the monitoring units 10. An exemplary case can be assumed where a battery monitoring device 1 is produced that uses the battery modules 2-1 through 2-5 having the monitoring units 10-1 through 10-5 for which identification information is not set in the factory and that the power source of the control unit 3 is turned on in the factory. A case can also be assumed where when one of the battery modules 2 is exchanged by a maintenance person at the store of a vehicle having the battery monitoring device 1, the identification information of at least the monitoring unit 10-5 is cleared by using a service tool and the power source of the control unit 3 is turned on. In such a case, it is possible to prevent the user side that uses the vehicle with the battery monitoring device 1 from shifting to the identification information setting process. This prevents a situation where the identification information setting process is performed after the battery modules 2 are exchanged by the user, making it possible to prevent a malfunction of the battery monitoring device 1 from being caused by setting the same identification information for the plurality of monitoring units 10.

Figure 4:
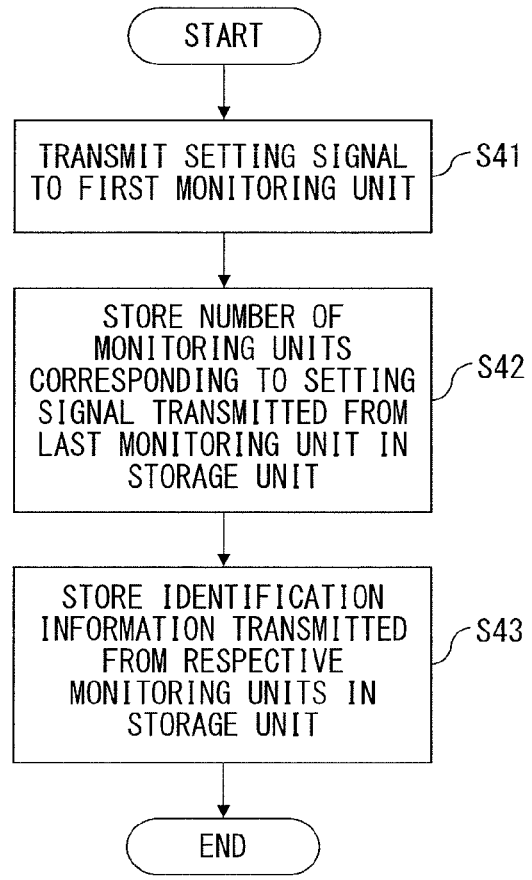
FIG. 4 is a flowchart showing operations of the control unit after shifting to an identification information setting process.

FIG. 4 is a flowchart showing operations of the control unit 3 after shifting to the identification information setting process.

First, the control unit 3 transmits a setting signal to the first monitoring unit 10-1 (S41).

Next, the control unit 3 stores in the storage unit 17 the number of the monitoring units 10 corresponding to the setting signal transmitted from the last monitoring unit 10-5 or the number of the battery modules 2 (S42).

Then, the control unit 3 receives identification information transmitted from the monitoring units 10-1 through 10-5 so as to store the received identification information in the storage unit 17 (S43).

Figure 5:
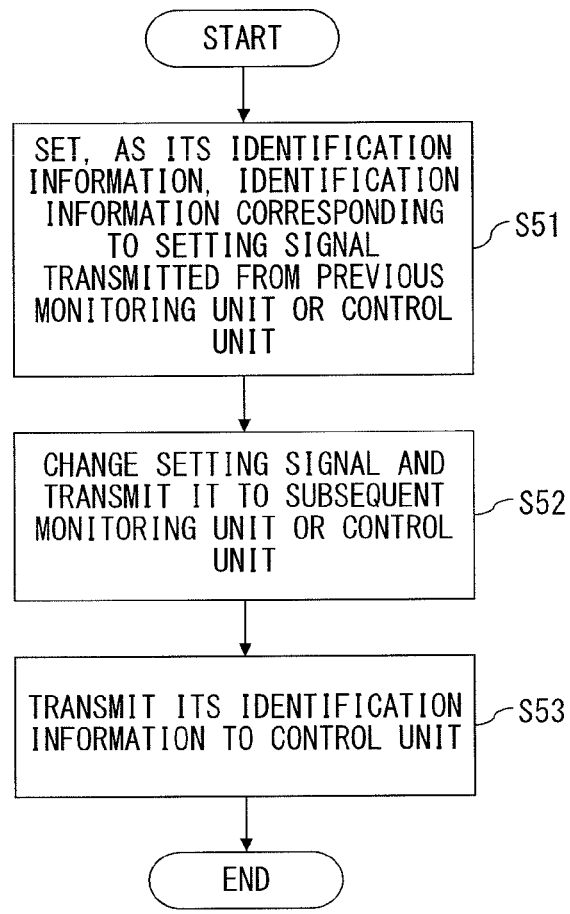
FIG. 5 is a flowchart showing operations of the monitoring unit after shifting to the identification information setting process.

FIG. 5 is a flowchart showing operations of each of the monitoring units 10-1 through 10-5 after shifting to the identification information setting process.

First, each of the monitoring units 10-1 through 10-5 sets identification information corresponding to a setting signal transmitted from the previous monitoring unit 10 or the control unit 3 as its identification information (S51), and changes the setting signal so as to transmit the setting signal to the subsequent monitoring unit 10 or the control unit 3 (S52).

Next, each of the monitoring units 10-1 through 10-5 transmits its identification information to the control unit 3 (S53). Note that a communication line used for transmitting identification information from the monitoring units 10-1 through 10-5 to the control unit 3 may be different from one used for transmitting an unset signal or a setting signal.

It is assumed for example that the information shown in FIG. 6 or FIG. 7 is stored in the storage unit 13 of each of the monitoring units 10-1 through 10-5 and that the information shown in FIG. 6 and FIG. 8 is stored in the storage unit 17 of the control unit 3. It is also assumed that identification information is not set for the monitoring units 10-1 through 10-5. It is also assumed that a communication abnormality has not occurred between the control unit 3 and the monitoring unit 10 or between the monitoring units 10. It is also assumed that, upon receiving a rectangular wave equivalent to a setting signal, each of the monitoring units 10-1 through 10-5 changes the DUTY ratio of the rectangular wave by +4% so as to transmit the rectangular wave to the subsequent monitoring unit 10 or the control unit 3.

In such a case, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5.

Next, each of the monitoring units 10-1 through 10-5, having its power source turned on, determines that identification information has not been set for it and transmits a rectangular wave with a DUTY ratio of 50% that is equivalent to an unset signal to the subsequent monitoring unit 10 or the control unit 3.

Next, upon receiving a rectangular wave with a DUTY ratio of 50% transmitted from the last monitoring unit 10-5 during a period between the turning on of the power sources of the monitoring units 10-1 through 10-5 and the elapsing of a prescribed period of time, the control unit 3 refers to the information shown in FIG. 6 and determines the received rectangular wave to be equivalent to an unset signal, and shifts to the identification information setting process.

Next, after shifting to the identification information setting process, the control unit 3 transmits to the first monitoring unit 10-1 a rectangular wave with a DUTY ratio of 4% as a prescribed setting signal.

Next, upon determining the received rectangular wave with a DUTY ratio of 4% to be equivalent to the setting signal by referring to the information shown in FIG. 6, the monitoring unit 10-1 refers to the information shown in FIG. 7 so as to set "101", which corresponds to a DUTY ratio of 4%, as its identification information, and changes a DUTY ratio of the received rectangular wave by +4% so as to transmit the rectangular wave with a DUTY ratio of 8% to the subsequent monitoring unit 10-2.

Next, upon determining the received rectangular wave with a DUTY ratio of 8% to be equivalent to the setting signal by referring to the information shown in FIG. 6, the monitoring unit 10-2 refers to the information shown in FIG. 7 so as to set "102", which corresponds to a DUTY ratio of 8%, as its identification information, and changes a DUTY ratio of the received rectangular wave by +4% so as to transmit the rectangular wave with a DUTY ratio of 12% to the subsequent monitoring unit 10-3.

Next, upon determining the received rectangular wave with a DUTY ratio of 12% to be equivalent to the setting signal by referring to the information shown in FIG. 6, the monitoring unit 10-3 refers to the information shown in FIG. 7 so as to set "103", which corresponds to a DUTY ratio of 12%, as its identification information, and changes a DUTY ratio of the received rectangular wave by +4% so as to transmit the rectangular wave with a DUTY ratio of 16% to the subsequent monitoring unit 10-4.

Next, upon determining the received rectangular wave with a DUTY ratio of 16% to be equivalent to the setting signal by referring to the information shown in FIG. 6, the monitoring unit 10-4 refers to the information shown in FIG. 7 so as to set "104", which corresponds to a DUTY ratio of 16%, as its identification information, and changes a DUTY ratio of the received rectangular wave by +4% so as to transmit the rectangular wave with a DUTY ratio of 20% to the subsequent monitoring unit 10-5.

Next, upon determining the received rectangular wave with a DUTY ratio of 20% to be equivalent to the setting signal by referring to the information shown in FIG. 6, the monitoring unit 10-5 refers to the information shown in FIG. 7 so as to set "105", which corresponds to a DUTY ratio of 20%, as its identification information, and changes a DUTY ratio of the received rectangular wave by +4% so as to transmit the rectangular wave with a DUTY ratio of 24% to the control unit 3.

Next, upon determining the received rectangular wave with a DUTY ratio of 24% to be equivalent to the setting signal by referring to the information shown in FIG. 6, the control unit 3 refers to the information shown in FIG. 8 so as to store "5", which correspond to a DUTY ratio of 24%, in the storage unit 17 as the number of the monitoring units 10. Thereafter, the control unit 3 stores, in the storage unit 17, pieces of identification information "101" through "105" transmitted from the monitoring units 10-1 through 10-5.

Note that the amounts of changes of the DUTY ratios of rectangular waves caused by the monitoring units 10-1 through 10-5 are not limited to 4%.

While the information shown in FIG. 6 has a structure in which a DUTY ratio of a rectangular wave equivalent to an unset signal and a DUTY ratio of a rectangular wave equivalent to a setting signal have different values, it is a configuration in which when an unset signal is transmitted from the last monitoring unit 10-5 to the control unit 3 during a period between the turning on of the power sources of the monitoring units 10-1 through 10-5 and the elapse of a prescribed period of time, the identification information setting process is started, and it is also possible to employ a configuration in which a DUTY ratio of a rectangular wave equivalent to an unset signal and a DUTY ratio of a rectangular wave equivalent to a setting signal have the same value because the state before the shifting to the identification information setting process and the state after the shifting to the identification information setting process are distinguished in view of time.

Figure 9:
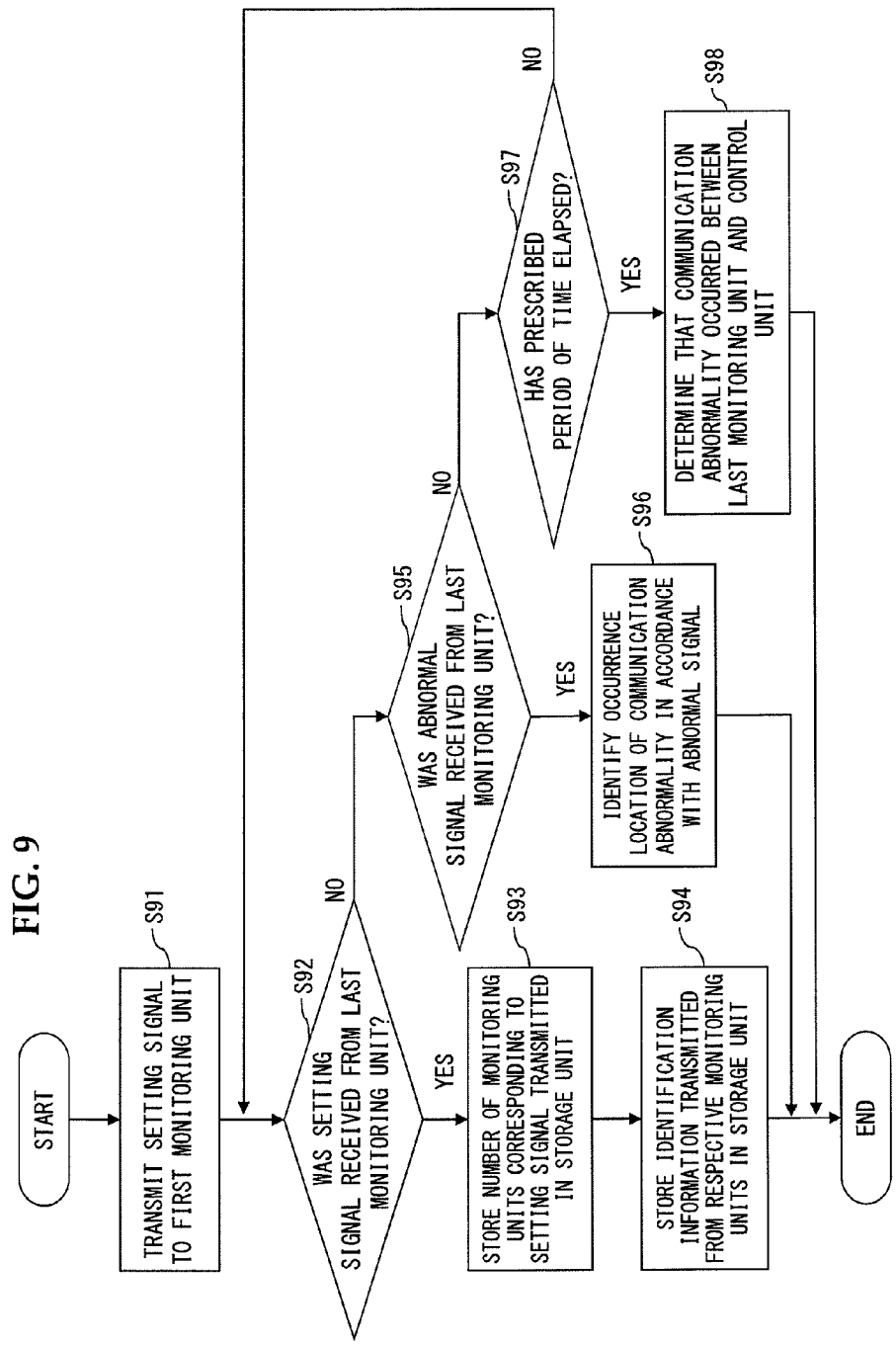
FIG. 9 is a flowchart showing operations of the control unit after shifting to the identification information setting process and the communication abnormality detection process.

FIG. 9 is a flowchart showing operations of the control unit 3 after shifting to the identification information setting process and the communication abnormality detection process.

First, the control unit 3 transmits a setting signal to the first monitoring unit 10-1 (S91).

Next, upon receiving a setting signal transmitted from the last monitoring unit 10-5 (Yes in S92), the control unit 3 stores in the storage unit 17 the number of the monitoring units 10 corresponding to the received setting signal (S93), and stores the identification information transmitted from the monitoring units 10-1 through 10-5 in the storage unit 17 (S94).

Also, upon receiving an abnormal signal from the last monitoring unit 10-5 (No in S92 and Yes in S95), the control unit 3 identifies the occurrence location of the communication abnormality in accordance with the received abnormal signal (S96).

Also, upon not receiving a setting signal or an abnormal signal from the last monitoring unit 10 even after a prescribed period of time has elapsed since the transmission of a setting signal to the first monitoring unit 10-1 (No in S95 and Yes in S97), the control unit 3 determines that a communication abnormality occurred between the last monitoring unit 10-5 and the control unit 3 (S98).

Figure 10:
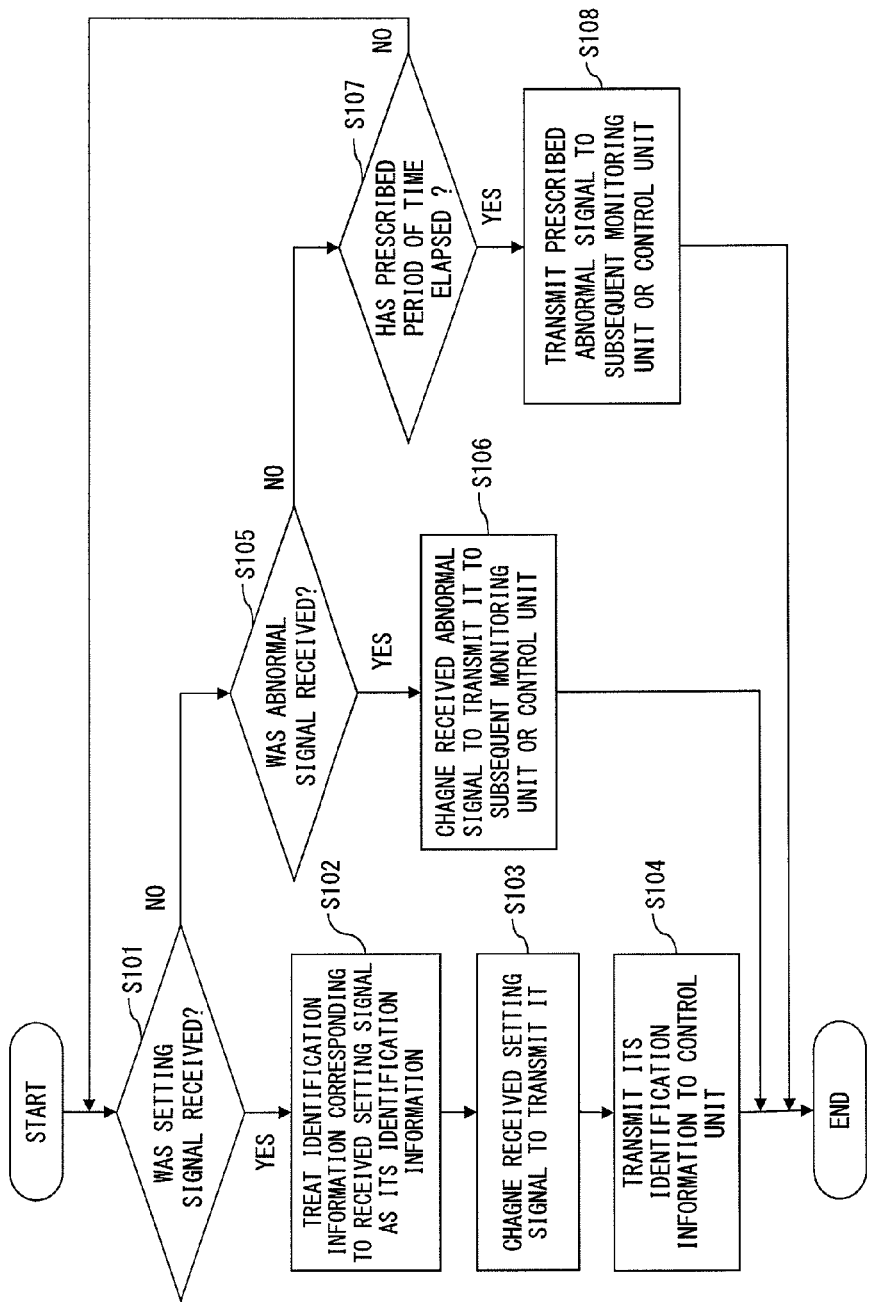
FIG. 10 is a flowchart showing operations of the monitoring unit after shifting to the identification information setting process and the communication abnormality detection process.

FIG. 10 is a flowchart showing operations of each of the monitoring units 10-1 through 10-5 after shifting to the identification information setting process and the communication abnormality detection process.

First, upon receiving a setting signal transmitted from the previous monitoring unit 10 or the control unit 3 (Yes in S101), each of the monitoring units 10-1 through 10-5 sets the identification information corresponding to the received setting signal as its identification information (S102), and changes the received setting signal so as to transmit the changed setting signal to the subsequent monitoring unit 10 or the control unit 3 (S103) and transmits its identification information to the control unit 3 (S104).

Also, upon receiving an abnormal signal transmitted from the previous monitoring unit 10 (No in S101 and Yes in S105), each of the monitoring units 10-1 through 10-5 changes the received abnormal signal so as to transmit the changed abnormal signal to the subsequent monitoring unit 10 or the control unit 3 (S106).

Also, upon not receiving the setting signal from the previous monitoring unit 10 or the control unit 3 even after a prescribed period of time has elapsed since its power source has been turned on or not receiving the abnormal signal from the previous monitoring unit 10 even after a prescribed period of time has elapsed since its power source has been turned on (No in S105 and Yes in S107), each of the monitoring units 10-1 through 10-5 transmits a prescribed abnormal signal to the subsequent monitoring unit 10 or the control unit 3 (S108).

It is assumed for example that the information shown in FIG. 7 and FIG. 11 is stored in the storage unit 13 of each of the monitoring units 10-1 through 10-5 and that the information shown in FIG. 8, FIG. 11 and FIG. 12 is stored in the storage unit 17 of the control unit 3. It is also assumed that identification information is not set for the monitoring units 10-1 through 10-5. It is also assumed that the communication line between the monitoring units 10-2 and 10-3 is disconnected. Upon receiving a rectangular waves equivalent to a setting signal or an abnormal signal, each of the monitoring units 10-1 through 10-5 changes the DUTY ratio of the rectangular wave by +4% so as to transmit the rectangular wave to the subsequent monitoring unit 10 or the control unit 3.

In such a case, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5.

Next, each of the monitoring units 10-1 through 10-5, having its power source turned on, determines that identification information has not been set for it and transmits a rectangular wave with a DUTY ratio of 50% that is equivalent to an unset signal to the subsequent monitoring unit 10 or the control unit 3.

Next, upon receiving a rectangular wave with a DUTY ratio of 50% transmitted from the last monitoring unit 10-5 during a period between the turning on of the power sources of the monitoring units 10-1 through 10-5 and the elapse of a prescribed period of time, the control unit 3 refers to the information shown in FIG. 11 and determines the received rectangular wave to be equivalent to an unset signal, and shifts to the identification information setting process.

Next, after shifting to the identification information setting process, the control unit 3 transmits to the first monitoring unit 10-1 a rectangular wave with a DUTY ratio of 4% as a prescribed setting signal.

Next, upon determining the received rectangular wave with a DUTY ratio of 4% to be equivalent to the setting signal by referring to the information shown in FIG. 11, the monitoring unit 10-1 refers to the information shown in FIG.

7 so as to set "101", which corresponds to a DUTY ratio of 4%, as its identification information, and changes a DUTY ratio of the received rectangular wave by +4% so as to transmit the rectangular wave with a DUTY ratio of 8% to the subsequent monitoring unit 10-2.

Next, upon determining the received rectangular wave with a DUTY ratio of 8% to be equivalent to the setting signal by referring to the information shown in FIG. 11, the monitoring unit 10-2 refers to the information shown in FIG. 7 so as to set "102", which corresponds to a DUTY ratio of 8%, as its identification information, and changes a DUTY ratio of the received rectangular wave by +4% so as to transmit the rectangular wave with a DUTY ratio of 12% to the subsequent monitoring unit 10-3.

Next, the monitoring unit 10-3, when it does not receive a rectangular wave equivalent to a setting signal or an abnormal signal before a prescribed period of time has elapsed since its power source has been turned on (when the voltage level remains low or high in the communication line between the monitoring units 10-2 and 10-3), transmits a rectangular wave with a DUTY ratio of 54% to the subsequent monitoring unit 10-4 as a prescribed abnormal signal.

Next, upon determining that the received rectangular wave with a DUTY ratio of 54% is equivalent to the abnormal signal by referring to the information shown in FIG. 11, the monitoring unit 10-4 changes a DUTY ratio of the received rectangular wave by +4% and transmits the rectangular wave with a DUTY ratio of 58% to the subsequent monitoring unit 10-5.

Next, upon determining that the received rectangular wave with a DUTY ratio of 58% is equivalent to the abnormal signal by referring to the information shown in FIG. 11, the monitoring unit 10-5 changes a DUTY ratio of the received rectangular wave by +4% and transmits the rectangular wave with a DUTY ratio of 62% to the control unit 3.

Then, upon determining that the rectangular wave with a DUTY ratio of 62% transmitted from the last monitoring unit 10-5 is equivalent to the abnormal signal by referring to the information shown in FIG. 11, the control unit 3 determines that the occurrence location of a communication abnormality corresponding to a DUTY ratio of 62% of the received rectangular wave is "between the monitoring units 10-2 and 10-3" by referring to the information shown in FIG. 12.

It is also possible to employ a configuration in which when the control unit 3 identifies the occurrence location of a communication abnormality, it reports that fact to the user.

Further, the amounts of changes of the DUTY ratios of rectangular waves caused by the monitoring units 10-1 through 10-5 are not limited to 4%.

While the information shown in FIG. 11 has a structure in which a DUTY ratio of a rectangular wave equivalent to an unset signal and a DUTY ratio of a rectangular wave equivalent to a setting signal have different values, it is a configuration in which when an unset signal is transmitted from the last monitoring unit 10-5 to the control unit 3 during a period between the turning on of the power sources of the monitoring units 10-1 through 10-5 and the elapse of a prescribed period of time, the identification information setting process and the communication abnormality detection process are started, and so it is also possible to employ a configuration in which a DUTY ratio of a rectangular wave equivalent to an unset signal and a DUTY ratio of a rectangular wave equivalent to a setting signal have the same value because the state before the shifting to the identification information setting process and the communication abnormality detection process and the state after the shifting to the identification information setting process and the communication abnormality detection process are distinguished in view of time.

The DUTY ratios of rectangular waves equivalent to abnormal signals are not particularly limited as long as they are different from a DUTY ratio of a rectangular wave equivalent to an unset signal and a DUTY ratio of a rectangular wave equivalent to a set signal.

Figure 13:
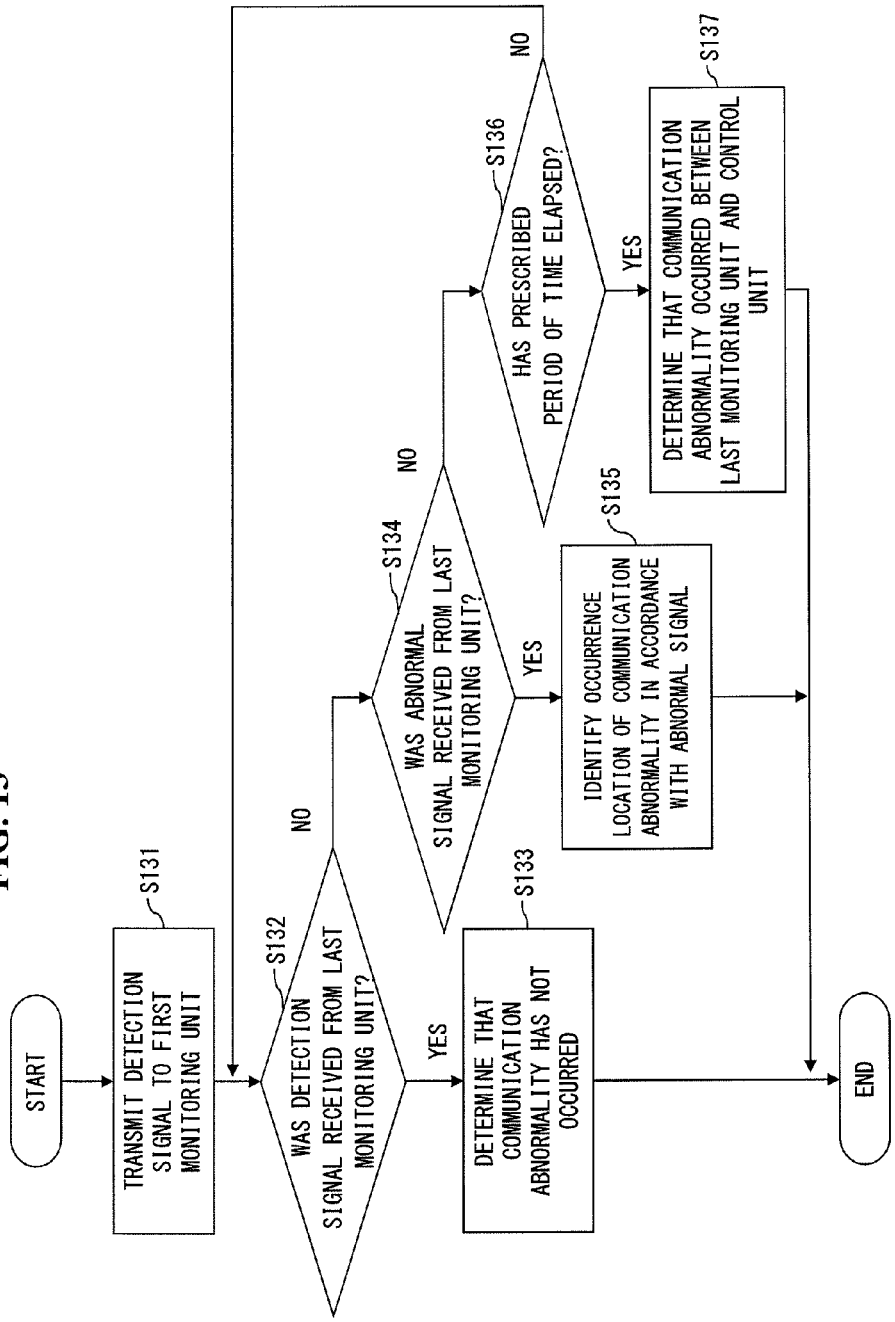
FIG. 13 is a flowchart showing operations of the control unit after shifting to the communication abnormality detection process.

FIG. 13 is a flowchart showing operations of the control unit 3 after shifting to the communication abnormality detection process.

First, the control unit 3 transmits a detection signal to the first monitoring unit 10-1 (S131).

Next, upon receiving a detection signal transmitted from the last monitoring unit 10-5 (Yes in S132), the control unit 3 determines that a communication abnormality has not occurred (S133).

Also, upon receiving an abnormal signal transmitted from the last monitoring unit 10-5 (No in S132 and Yes in S134), the control unit 3 identifies the occurrence location of a communication abnormality in accordance with the received abnormal signal (S135).

Also, upon not receiving a detection signal or an abnormal signal from the last monitoring unit 10-5 even after a prescribed period of time has elapsed since the transmission of a detection signal to the first monitoring unit 10-1 (No in S134 and Yes in S136), the control unit 3 determines that a communication abnormality occurred between the last monitoring unit 10-5 and the control unit 3 (S137).

Figure 14:
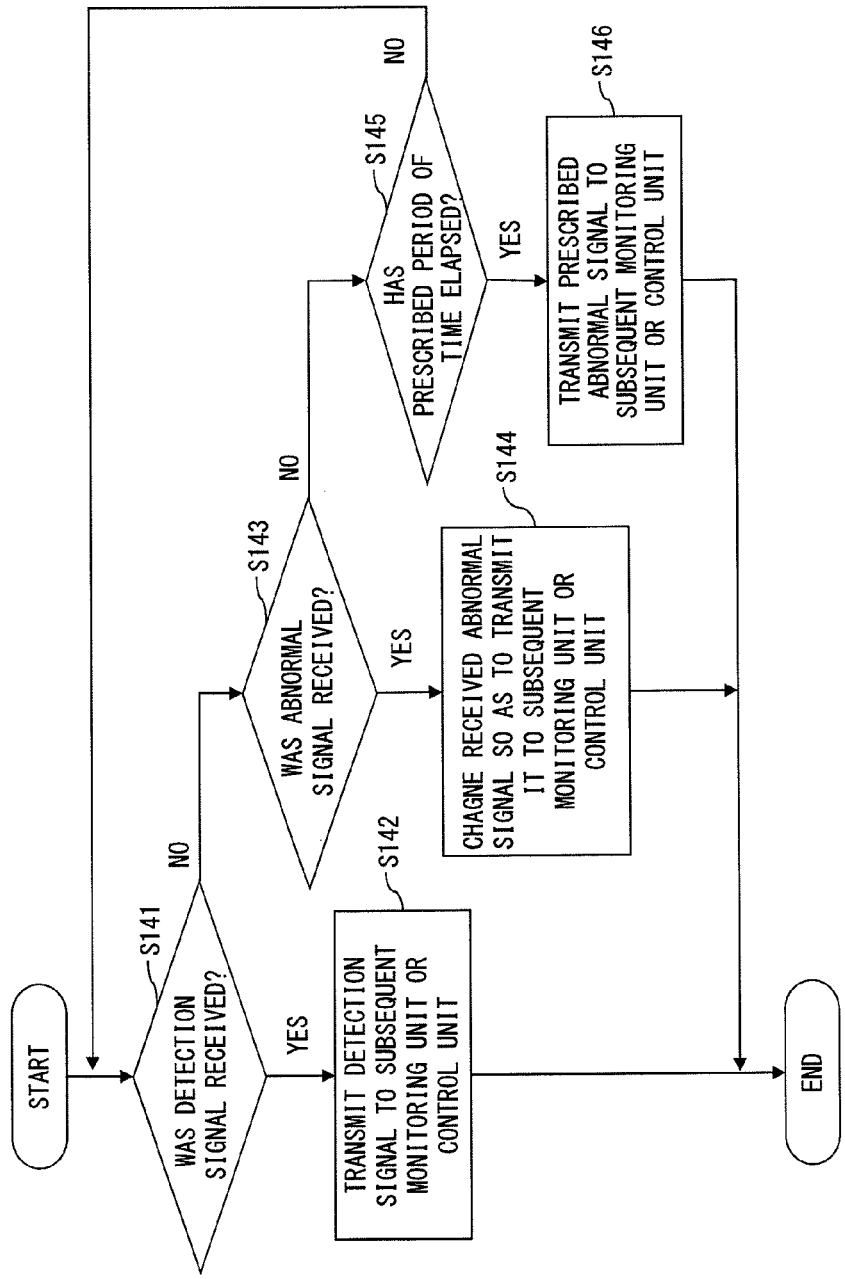
FIG. 14 is a flowchart showing operations of the monitoring unit after shifting to the communication abnormality detection process.

FIG. 14 is a flowchart showing operations of each of the monitoring units 10-1 through 10-5 after shifting to the communication abnormality detection process.

First, upon receiving a detection signal transmitted from the previous monitoring unit 10 or the control unit 3 (Yes in S141), each of the monitoring units 10-1 through 10-5 transmits the detection signal to the subsequent monitoring unit 10 or the control unit 3 (S142).

Also, upon receiving an abnormal signal transmitted from the previous monitoring unit 10 (No in S141 and Yes in S143), each of the monitoring units 10-1 through 10-5 changes the received abnormal signal so as to transmit the changed abnormal signal to the subsequent monitoring unit 10 or the control unit 3 (S144).

Also, upon not receiving the detection signal from the previous monitoring unit 10 or the control unit 3 even after a prescribed period of time has elapsed since its power source has been turned on or not receiving the abnormal signal from the previous monitoring unit 10 even after a prescribed period of time has elapsed since its power source has been turned on (No in S143 and Yes in S145), each of the monitoring units 10-1 through 10-5 transmits a prescribed abnormal signal to the subsequent monitoring unit 10 or the control unit 3 (S146).

It is assumed for example that the information shown in FIG. 15 is stored in the storage unit 13 of each of the monitoring units 10-1 through 10-5 and that the information shown in FIG. 12 and FIG. 15 is stored in the storage unit 17 of the control unit 3. It is also assumed that identification information is not set for the monitoring units 10-1 through 10-5. It is also assumed that the communication line between the monitoring units 10-2 and 10-3 is disconnected. Also, upon receiving a rectangular wave equivalent to an abnormal signal, each of the monitoring units 10-1 through 10-5 changes the DUTY ratio of the rectangular wave by +4% so as to transmit the rectangular wave to the subsequent monitoring unit 10 or the control unit 3.

In such a case, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5.

Next, each of the monitoring units 10-1 through 10-5, having its power source turned on, determines that identification information has not been set for it and transmits the rectangular wave with a DUTY ratio of 50% that is equivalent to an unset signal to the subsequent monitoring unit 10 or the control unit 3.

Next, upon receiving a rectangular wave with a DUTY ratio of 50% transmitted from the last monitoring unit 10-5 during a period between the turning on of the power sources of the monitoring units 10-1 through 10-5 and the elapsing of a prescribed period of time, the control unit 3 refers to the information shown in FIG. 15 and determines the received rectangular wave to be equivalent to an unset signal, and shifts to the communication abnormality detection process.

Next, after shifting to the communication abnormality detection process, the control unit 3 transmits to the first monitoring unit 10-1 a rectangular wave with a DUTY ratio of 10% as a detection signal.

Next, upon determining the received rectangular wave with a DUTY ratio of 10% to be equivalent to the detection signal by referring to the information shown in FIG. 15, the monitoring unit 10-1 transmits the rectangular wave with a DUTY ratio of 10% to the subsequent monitoring unit 10-2 as a detection signal.

Next, upon determining the received rectangular wave with a DUTY ratio of 10% to be equivalent to the detection signal by referring to the information shown in FIG. 15, the monitoring unit 10-2 transmits the rectangular wave with a DUTY ratio of 10% to the subsequent monitoring unit 10-3 as a detection signal.

Next, the monitoring unit 10-3, when it does not receive a rectangular wave equivalent to a detection signal or an abnormal signal before a prescribed period of time has elapsed since its power source has been turned on (when the voltage level remains low or high in the communication line between the monitoring units 10-2 and 10-3), transmits a rectangular wave with a DUTY ratio of 54% to the subsequent monitoring unit 10-4 as a prescribed abnormal signal.

Next, upon determining that the received rectangular wave with a DUTY ratio of 54% is equivalent to the abnormal signal by referring to the information shown in FIG. 15, the monitoring unit 10-4 changes a DUTY ratio of the received rectangular wave by +4% and transmits the rectangular wave with a DUTY ratio of 58% to the subsequent monitoring unit 10-5.

Next, upon determining that the received rectangular wave with a DUTY ratio of 58% is equivalent to the abnormal signal by referring to the information shown in FIG. 15, the monitoring unit 10-5 changes a DUTY ratio of the received rectangular wave by +4% and transmits the rectangular wave with a DUTY ratio of 62% to the control unit 3.

Then, upon determining that the rectangular wave with a DUTY ratio of 62% transmitted from the last monitoring unit 10-5 is equivalent to the abnormal signal by referring to the information shown in FIG. 15, the control unit 3 determines that the occurrence location of a communication abnormality corresponding to a DUTY ratio of 62% of the received rectangular wave is "between the monitoring units 10-2 and 10-3" by referring to the information shown in FIG. 12.

Note that upon determining that the rectangular wave with a DUTY ratio of 10% transmitted from the last monitoring unit 10-5 is a detection signal by referring to the information shown in FIG. 15, the control unit 3 determines that a communication abnormality has not occurred.

It is also possible to employ a configuration in which when the control unit 3 identifies the occurrence location of a communication abnormality, it reports the occurrence location of the communication abnormality to the user.

Note that the amounts of changes of the DUTY ratios of rectangular waves caused by the monitoring units 10-1 through 10-5 are not limited to 4%.

While the information shown in FIG. 15 has a structure in which a DUTY ratio of a rectangular wave equivalent to an unset signal and a DUTY ratio of a rectangular wave equivalent to a detection signal have different values, it is a configuration in which when an unset signal is transmitted from the last monitoring unit 10-5 to the control unit 3 during a period between the turning on of the power sources of the monitoring units 10-1 through 10-5 and the elapse of a prescribed period of time, the communication abnormality detection process is started, and it is also possible to employ a configuration in which a DUTY ratio of a rectangular wave equivalent to an unset signal and a DUTY ratio of a rectangular wave equivalent to a detection signal have the same value because the state before the shifting to the communication abnormality detection process and the state after the shifting to the communication abnormality detection process are distinguished in view of time.

Also, the battery monitoring device 1 of the embodiment employs a configuration of performing an identification information setting process and a communication abnormality detection process by using a rectangular wave having the DUTY ratio that is changed by monitoring units, making it possible to employ a simpler configuration for the monitoring units 10 than in a case when an identification information setting process and a communication abnormality detection process are performed by using a signal that requires complicated processes such as a modulation process, an encoding process, etc.

The above embodiment employs a configuration in which an identification information setting process and a communication abnormality detection process are performed by using the DUTY ratios of rectangular waves; however it is also possible to perform an assignment process of identification information and a communication abnormality detection process by using the frequency or the number of pulses per unit time of an oscillation signal including a rectangular wave, or a numerical value or character information expressed by an oscillation signal including a rectangular wave.

EXPLANATIONS OF NUMERALS

1: BATTERY MONITORING DEVICE
2: BATTERY MODULE
3: CONTROL UNIT
4: MAIN RELAY
5: BATTERY
6: RELAY
7: VOLTAGE DETECTION UNIT
8: CURRENT DETECTION UNIT
9: TEMPERATURE DETECTION UNIT
10: MONITORING UNIT
11: LOAD
12: RELAY CONTROL UNIT
13: STORAGE UNIT

14: IDENTIFICATION INFORMATION SETTING UNIT
15: COMMUNICATION UNIT
16: RELAY CONTROL UNIT
17: STORAGE UNIT
18: COMMUNICATION ABNORMALITY LOCATION IDENTIFICATION UNIT
19: COMMUNICATION UNIT

What is claimed is:

1. A battery monitoring device comprising:
a plurality of monitoring units that monitor a state of a battery; and
a control unit that is connected to the plurality of monitoring units in series and that communicates with the plurality of monitoring units by using identification information set for the plurality of monitoring units, wherein
each of the plurality of monitoring units, when identification information is not set therefor, transmits, to the subsequent monitoring unit or the control unit, a fixed unset signal that indicates that identification information has not been set therefor, regardless of signal transmitted from the previous monitoring unit or the control unit, and
upon receiving the unset signal transmitted from the last monitoring unit, the control unit shifts to at least one of an identification information setting process and a communication abnormality detection process.

2. The battery monitoring device according to claim 1, wherein
after shifting to the identification information setting process,
the control unit transmits a setting signal to the first monitoring unit, and
each of the plurality of monitoring units assigns, as identification information thereof, a piece of identification information corresponding to the setting signal transmitted from the previous monitoring unit or the control unit, and changes the setting signal so as to transmit the setting signal to the subsequent monitoring unit or the control unit.

3. The battery monitoring device according to claim 2, wherein
in a case where it is not possible to receive the setting signal, each of the plurality of monitoring units transmits an abnormal signal to the subsequent monitoring unit or the control unit, and when receiving the abnormal signal from the previous monitoring unit, each of the plurality of monitoring units changes the abnormal signal so as to transmit the abnormal signal to the subsequent monitoring unit or the control unit, and
the control unit identifies an occurrence location of a communication abnormality in accordance with the abnormal signal transmitted from the last monitoring unit.

4. The battery monitoring device according to claim 1, wherein
after shifting to the communication abnormality detection process,
the control unit transmits a detection signal to the first monitoring unit,
upon receiving the detection signal transmitted from the previous monitoring unit or the control unit, each of the plurality of monitoring units transmits the detection signal to the subsequent monitoring unit or the control unit, and in a case where it is not possible to receive the detection signal, each of the plurality of monitoring units transmits an abnormal signal to the subsequent monitoring unit or the control unit, and upon receiving the abnormal signal transmitted from the previous monitoring unit, each of the plurality of monitoring units changes the abnormal signal so as to transmit the abnormal signal to the subsequent monitoring unit or the control unit, and
the control unit identifies an occurrence location of a communication abnormality in accordance with the abnormal signal transmitted from the last monitoring unit.

5. The battery monitoring device according to claim 1, wherein
the unset signal is a signal of a fixed DUTY ratio, a frequency, or the number of pulses per unit time.

6. The battery monitoring device according to claim 2, wherein
each of the plurality of monitoring units changes DUTY ratio, frequency, or the number of pulses per unit time of the setting signal so as to transmit the setting signal to the subsequent monitoring unit or the control unit.

7. The battery monitoring device according to claim 3, wherein
each of the plurality of monitoring units changes DUTY ratio, frequency, or the number of pulses per unit time of the abnormal signal so as to transmit the abnormal signal to the subsequent monitoring unit or the control unit.

8. The battery monitoring device according to claim 4, wherein
each of the plurality of monitoring units changes DUTY ratio, frequency, or the number of pulses per unit time of the abnormal signal so as to transmit the abnormal signal to the subsequent monitoring unit or the control unit.

* * * * *